United States Patent
Fang et al.

(10) Patent No.: US 10,840,581 B2
(45) Date of Patent: Nov. 17, 2020

(54) ELECTRONIC PACKAGE

(71) Applicant: Siliconware Precision Industries Co., Ltd., Taichung (TW)

(72) Inventors: Bo-Siang Fang, Taichung (TW); Kuan-Ta Chen, Taichung (TW); Chia-Chu Lai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 121 days.

(21) Appl. No.: 16/232,840

(22) Filed: Dec. 26, 2018

(65) Prior Publication Data

US 2020/0052393 A1 Feb. 13, 2020

(30) Foreign Application Priority Data

Aug. 7, 2018 (TW) .............................. 107127441 A

(51) Int. Cl.
*H01Q 1/22* (2006.01)
*H01Q 9/04* (2006.01)

(52) U.S. Cl.
CPC ......... *H01Q 1/2283* (2013.01); *H01Q 9/0414* (2013.01)

(58) Field of Classification Search
CPC ........ H01Q 1/2283; H01Q 1/38; H01Q 5/378; H01Q 5/385; H01Q 5/392; H01Q 9/0407; H01Q 9/0414; H01Q 19/005; H01Q 23/00

See application file for complete search history.

(56) References Cited

U.S. PATENT DOCUMENTS

2016/0049723 A1* 2/2016 Baks .................... H01Q 1/2291
343/848
2016/0336646 A1* 11/2016 Baek ..................... H01Q 1/243

* cited by examiner

*Primary Examiner* — Robert Karacsony
(74) *Attorney, Agent, or Firm* — Mintz Levin Cohn Ferris Glovsky and Popeo, P.C.; Peter F. Corless; Steven M. Jensen

(57) ABSTRACT

An electronic package is provided with a first substrate having a first antenna portion that is stacked on a second substrate having a second antenna portion via an antenna component. During a packaging process, a gap between the first substrate and the second substrate is held constantly by the antenna component. At the same time, the antenna component is regarded as a third antenna portion of the electronic package. The performance of the antennae is not adversely affected by the antenna component despite the fact that the antenna component is in close proximity to the first and second antenna portions.

12 Claims, 2 Drawing Sheets

ELECTRONIC PACKAGE

CROSS-REFERENCE TO RELATED APPLICATION

This Application claims under 35 U.S.C. § 119(a) the benefit of Taiwanese Patent Application No. 107127441 filed on Aug. 7, 2018. The entire contents of these applications are incorporated herein by reference in their entirety.

BACKGROUND

1. Technical Field

The present disclosure relates to electronic packages, and, more particularly, to an electronic package with antenna structures.

2. Description of Related Art

Existing wireless communication technology has been extensively used in a variety of consumer electronic products for receiving and/or transmitting various wireless signals. In meeting the design requirements of the consumer electronic products, wireless communication modules are manufactured and designed with compactness and light weight in mind. Among them, patch antenna has been widely adopted in wireless communication modules of electronic products (such as cell phones) due to its small size, light weight, and ease of manufacture.

However, traditional patch antennae tend to suffer from narrow bandwidth. As a result, in practice, one patch antenna is often stacked right on top of another to provide for an additional resonant frequency. With appropriate design, the additional resonant frequency is shifted close to that of the lower antenna, thereby increasing the bandwidth of the antennae with the two resonant points.

FIGS. 1A and 1B are cross-sectional and top views of a conventional wireless communication module 1, respectively. The wireless communication module 1 includes a wiring board 10 which is provided with a semiconductor chip 11 on the lower side thereof, whereas an antenna substrate 12 having an antenna layer 120 is stacked on top of the upper side of the wiring board 10 via a plurality of supporting bumps 18 and conductive bumps 13 (not shown in FIG. 1A). The wiring board 10 is further provided with an antenna portion 100 on the upper side thereof; a ground layer 101 therein; an antenna feed line 102 connecting the antenna portion 100 and the ground layer 101; and a plurality of solder balls 19 formed on the lower side of the wiring board 10. The supporting bumps 18 are not electrically connected to the wiring board 10 and the antenna substrate 12. The conductive bumps 13 are electrically connected to the wiring board 10 and the antenna substrate 12.

For lower band applications, such as 28 GHz in 5G mobile communication, the antenna layer 120 and the antenna portion 100 of the wireless communication module 1 use air as the medium between them, so a particular area between the wiring board 10 and the antenna substrate 12 is defined as an air zone A (i.e., an area surrounded by the supporting bumps 18 and the conductive bumps 13 with no adhesives or molding compound). The quality of transmission signals between the antenna layer 120 and the semiconductor chip 11 can be ensured by controlling the gap H between the wiring board 10 and the antenna substrate 12, in particular, the precision of the gap H can be controlled through the supporting bumps 18.

However, in the traditional wireless communication module 1, the supporting bumps 18 contain metal materials and are not electrically connected to the wiring board 10 and the antenna substrate 12. Thus, they may result in undesirable electromagnetic interference that affects the functioning of the antennae. In overcoming this, the supporting bumps 18 are required to be located away from the air zone A (as shown in FIG. 1B) to prevent the supporting bumps 18 from degrading the performance of the antennae. Therefore, the area of the wiring board 10 has to take into account extra space for a margin L that is occupied by the supporting bumps 18 being kept at a certain distance from the air zone A. However, this makes it more difficult to reduce the size of the wiring board 10 and leads to a less efficient use of the space of the wireless communication module 1.

Therefore, there is a need for a solution that addresses the aforementioned issues in the prior art.

SUMMARY

In view of the aforementioned shortcomings of the prior art, the present disclosure provides an electronic package, which may include: a first substrate including a first wiring layer and a first antenna portion electrically insulated from the first wiring layer; a second substrate stacked on the first substrate and including a second wiring layer and a second antenna portion electrically insulated from the second wiring layer, wherein the first antenna portion and the second antenna portion are provided within a projected space of an active zone formed between the first substrate and the second substrate to allow inductive coupling between the first antenna portion and the second antenna portion; and an antenna component provided between the first substrate and the second substrate and attaching the first substrate to the second substrate, wherein the antenna component is provided within the active zone but not electrically connected to the first wiring layer and the second wiring layer.

In an embodiment, an area between the first substrate and the second substrate is defined with the active zone and a conducting zone sequentially outward from the center thereof, and the conducting zone is provided with a plurality of conductive elements for electrically connecting the first wiring layer and the second wiring layer. In another embodiment, the conductive elements are not electrically connected with the first antenna portion and the second antenna portion.

In an embodiment, the antenna component is made of a material including metal.

In an embodiment, the antenna component is in a form of a bump.

In an embodiment, the first substrate may include an antenna trace provided in the active zone and connected with the antenna component, such that the antenna component and the antenna trace constitute a daisy chain structure or a resonator.

In an embodiment, the second substrate may include an antenna trace provided in the active zone and connected with the antenna components, such that the antenna components and the antenna trace constitute a daisy chain structure or a resonator.

In an embodiment, the electronic package further includes an electronic component provided on the second substrate.

In an embodiment, the first substrate is an antenna board, and the second substrate is a wiring board. In another embodiment, the second substrate may include a ground layer and an antenna feed line connecting the second antenna portion with the ground layer.

As can be understood from the above, in the electronic package in accordance with the present disclosure, the antenna component is configured to be within the active zone and attach the first substrate to the second substrate. Thus, as compared to the prior art, the second substrate does not need to provide additional leeway for accommodating the antenna components. As a result, the area of the second substrate can be reduced as needed, which in turn improves the space utilization of the electronic package.

In addition, the antenna component is further configured to form a resonator with the antenna trace(s). This is equivalent to incorporation of a third antenna portion into the electronic package. Therefore, compared to the prior art, despite the fact that the antenna components are in close proximity to the first antenna portion and the second antenna portion, the performance of the antennae is not adversely affected by the antenna components.

DETAILED DESCRIPTION OF THE EMBODIMENTS

Figure 1A:
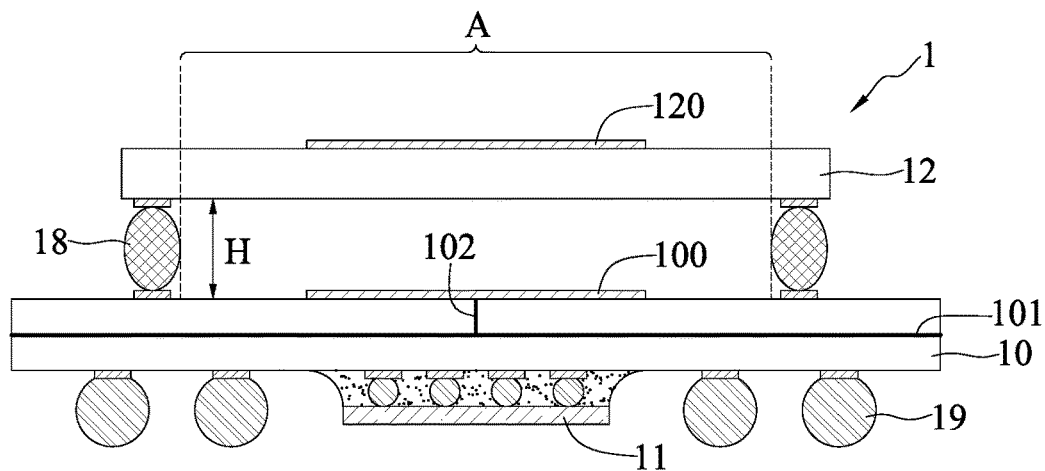
FIG. 1A is a cross-sectional schematic diagram of a wireless communication module of the prior art.
Figure 1B:
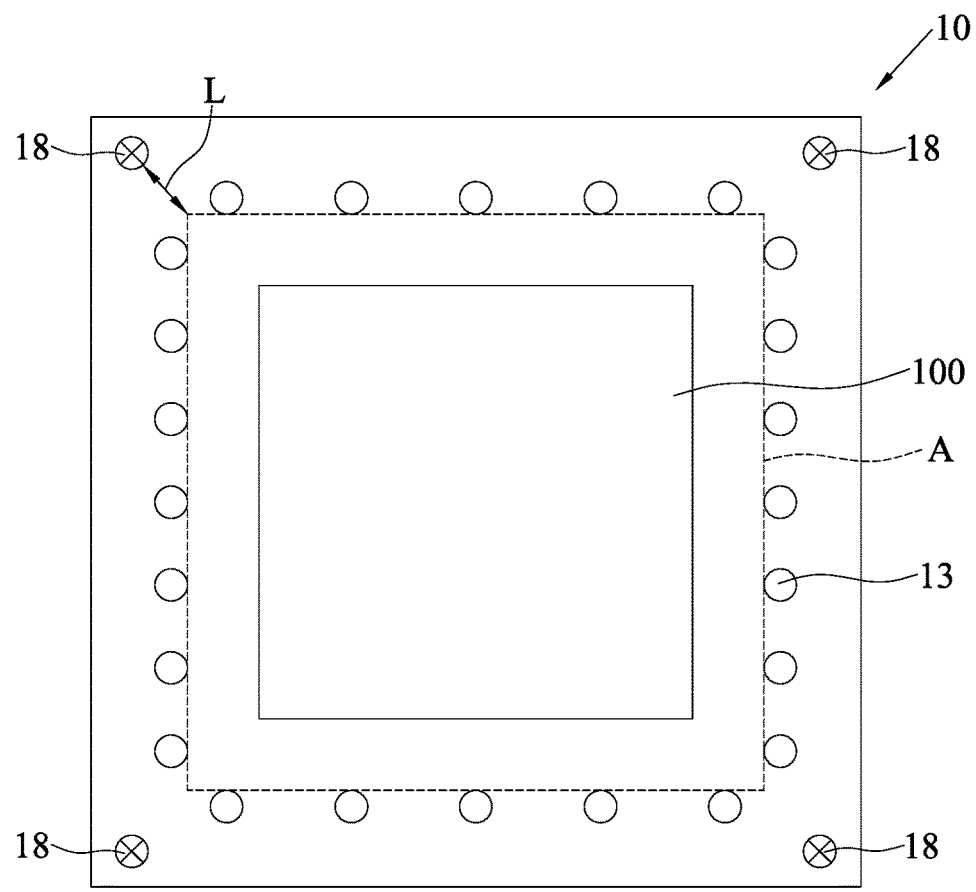
FIG. 1B is a top view of a wiring board in FIG. 1A.

The technical content of present disclosure is described by the following specific embodiments. One of ordinary skill in the art can readily understand the advantages and effects of the present disclosure upon reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "first", "second", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2A:
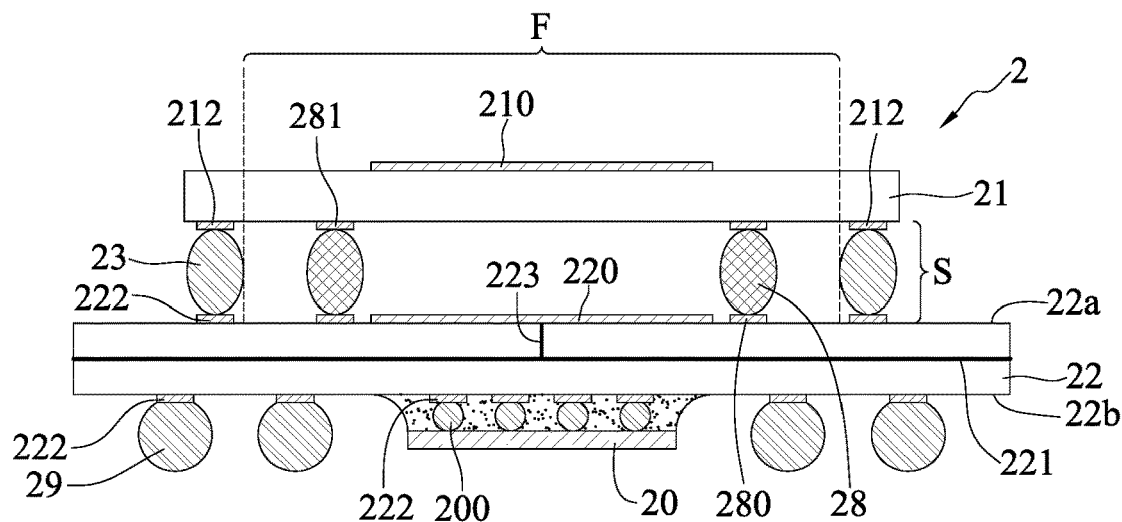
FIG. 2A is a cross-sectional schematic diagram of an electronic package in accordance with the present disclosure.

FIG. 2A is a cross-sectional schematic diagram of an electronic package 2 in accordance with the present disclosure. The electronic package 2 includes a first substrate 21, a second substrate 22, a plurality of conductive elements 23, at least one electronic component 20 provided on the second substrate 22, and a plurality of antenna components 28.

The first substrate 21 is an antenna board having a first antenna portion 210 and a plurality of first wiring layers 212.

The first antenna portion 210 can be a line or patch antenna and electrically insulated from the first wiring layer 212. It can be appreciated that the first substrate 21 can also be other types of antenna boards, and the present disclosure is not limited as such.

In an embodiment, the first antenna portion 210 is in the form of a flat sheet, such as a rectangular sheet.

The second substrate 22 is stacked on the first substrate 21. The second substrate 22 includes a second antenna portion 220. An active zone F is formed in an area S surrounded between the first substrate 21 and the second substrate 22. The first antenna portion 210 and the second antenna portion 220 are located within the projected space of the active zone F.

In an embodiment, the second substrate 22 is a wiring board with a width larger than that of the first substrate 21. The second substrate 22 includes a first side 22a and a second side 22b opposite to each other. The first substrate 21 is stacked on the first side 22a of the second substrate 22.

In an embodiment, the second substrate 22 includes a ground layer 221, an antenna feed line 223 connecting the second antenna portion 220 and the ground layer 221, and second wiring layers 222. The second antenna portion 220 is a line or patch antenna, which is electrically connected to the ground layer 221 but electrically insulated from the second wiring layers 222.

In an embodiment, the second antenna portion 220 is in the form of a flat sheet, such as a rectangular sheet corresponding to the first antenna portion 210, such that the first antenna portion 210 and the second antenna portion 220 are inductively coupled to allow signals to be transmitted therebetween.

In an embodiment, a plurality of solder balls 29 can be formed on the second wiring layer 222 on the second side 22b of the second substrate 22, so that the second substrate 22 can be further connected with another electronic structure (e.g., a circuit board or another wiring board) by reflow of the solder balls 29. The antenna components 28 are disposed between the first substrate 21 and the second substrate 22 and within the active zone F.

In an embodiment, the antenna components 28 are bump-shaped for attaching the first substrate 21 to the second substrate 22. The antenna components 28 are made of metal material, such as copper core balls.

In an embodiment, a third wiring layer is formed on the first side 22a of the second substrate 22 to allow the antenna components 28 to be provided thereon. In an embodiment, the third wiring layer can be used as an antenna trace 280 located inside the active zone F and surrounding the second antenna portion 220. It can be appreciated that an antenna trace 281 can also be formed on the lower surface of the first substrate 21 to bond with the antenna components 28. As such, the antenna components 28 and the antenna trace 280, 281 constitute a daisy chain structure or a resonator. The resonant frequency of daisy chain structure or resonator can be made to be close to the resonant points of the first and second antenna portions 210, 220 by controlling the length and shape of this daisy chain structure or resonator formed of the antenna components 28 and its antenna trace 280, 281. As a result, the resonant points and thus the bandwidth of the electronic package 2 of the present disclosure can be increased.

In an embodiment, the antenna trace 280, 281 can be continuous lines or non-continuous wires, such as straight wires, arc wires or wires of other shapes.

The conductive elements 23 are provided on the first side 22a of the second substrate 22 and sandwiched between the first substrate 21 and the second substrate 22 in order to support the first substrate 21 on the second substrate 22.

In an embodiment, the conductive elements 23 are electrically connected with the first wiring layer 212 and the second wiring layer 222, so that the first substrate 21 is electrically connected with the second substrate 22.

In an embodiment, the conductive elements 23 are copper pillars, soldering materials, or other structures, and the present disclosure is not limited as such.

In an embodiment, the conductive elements 23 are not electrically connected with the first antenna portion 210 and the second antenna portion 220.

Figure 2B:
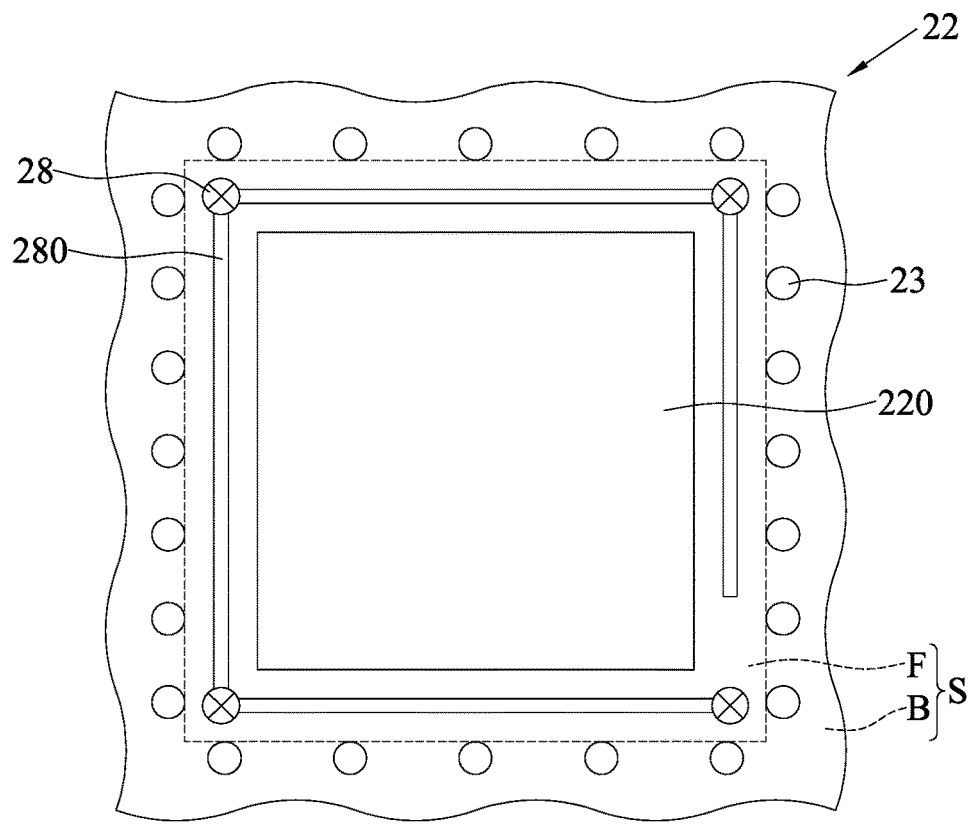
FIG. 2B is a top view of a second substrate in FIG. 2A.

As shown in FIG. 2B, an area S between the first substrate 21 and the second substrate 22 is defined with an active zone F and a conducting zone B sequentially outward from the center. The active zone F is kept empty and free of any adhesive, molding compound or other materials to ensure quality of signals transmitted between the first and second antenna portions 210, 220. The conducting zone B is available for the conductive elements 23 to be arranged thereon, such that the conductive elements 23 surround the active zone F.

The electronic component 20 is provided on the second side 22b of the second substrate 22.

In an embodiment, the electronic component 20 can be an active component, a passive component, or a combination thereof; the active component can be, for example, a semiconductor chip, and the passive component can be, for example, a resistor, a capacitor, or an inductor. In an embodiment, the electronic component 20 can be electrically connected with the second wiring layer 222 in a flip-chip manner via a plurality of conductive bumps 200, such as soldering materials. In another embodiment, the electronic component 20 can be electrically connected to the second wiring layer 222 via a plurality of solder wires (not shown) by the wire bonding technique. In yet another embodiment, the electronic component 20 can be made to be in direct contact with second wiring layer 222 and electrically connected with the second wiring layer 222. However, the present disclosure does not limit the way in which the electronic component 20 is electrically connected with the second substrate 22.

Although the electronic component 20 is shown as not provided between the first substrate 21 and the second substrate 22, there are various ways of arranging the electronic component, for example, on the first side 22a of the second substrate 22, and the present disclosure is not limited as such. Therefore, in the electronic package 2 in accordance with the present disclosure, the antenna components 28 are configured to be within the active zone F and attached to the first and second substrates 21 and 22, allowing the gap between the first and second substrates 21 and 22 to be held constant. Thus, compared to the prior art, the second substrate 22 does not need to provide additional leeway for accommodating the antenna components 28, and as a result, the area of the second substrate 22 can be reduced as needed to improve the utilization of space of the electronic package 2.

In an embodiment, the antenna components 28 are further configured to form a daisy chain structure or a resonator with the antenna trace(s) 280, 281 in the form of wires. This is equivalent to incorporating a third antenna portion into the electronic package 2. Therefore, compared to the prior art, despite the fact that the antenna components 28 are in close proximity to the first antenna portion 210 and the second antenna portion 220, the performance of the antennae is not adversely affected by the antenna components 28.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. An electronic package, comprising:
   a first substrate including a first wiring layer and a first antenna portion electrically insulated from the first wiring layer;
   a second substrate stacked on the first substrate and including a second wiring layer and a second antenna portion electrically insulated from the second wiring layer, wherein the first antenna portion and the second antenna portion are provided within a projected space of an active zone formed between the first substrate and the second substrate to allow inductive coupling between the first antenna portion and the second antenna portion, and wherein the second substrate includes a ground layer and an antenna feed line connecting the second antenna portion with the ground layer; and
   an antenna component provided between the first substrate and the second substrate and attaching the first substrate to the second substrate, wherein the antenna component is provided within the active zone and is free from being electrically connected to the first wiring layer and the second wiring layer.

2. The electronic package of claim 1, wherein an area between the first substrate and the second substrate is defined with the active zone and a conducting zone sequentially outward from a center thereof.

3. The electronic package of claim 2, wherein the conducting zone is provided with a plurality of conductive elements configured for electrically connecting the first wiring layer and the second wiring layer.

4. The electronic package of claim 3, wherein the conductive elements are free from being electrically connected with the first antenna portion and the second antenna portion.

5. The electronic package of claim 1, wherein the antenna component is made of a material including metal.

6. The electronic package of claim 1, wherein the antenna component is in a form of a bump.

7. The electronic package of claim 1, wherein the first substrate includes an antenna trace provided in the active zone and connected with the antenna component.

8. The electronic package of claim 7, wherein the antenna component and the antenna trace constitute a daisy chain structure or a resonator.

9. The electronic package of claim 1, wherein the second substrate includes an antenna trace provided in the active zone and connected with the antenna component.

10. The electronic package of claim 9, wherein the antenna component and the antenna trace constitute a daisy chain structure or a resonator.

11. The electronic package of claim 1, further comprising an electronic component provided on the second substrate.

12. The electronic package of claim 1, wherein the first substrate is an antenna board, and the second substrate is a wiring board.

* * * * *